United States Patent
Kamiya

(10) Patent No.: US 10,503,055 B2
(45) Date of Patent: Dec. 10, 2019

(54) ACCESSORY SHOE DEVICE CAPABLE OF PREVENTING FALL-OFF OF FASTENING SCREW BY SAVING SPACE, AND ELECTRONIC APPARATUS

(71) Applicant: CANON KABUSHIKI KAISHA, Tokyo (JP)

(72) Inventor: Jun Kamiya, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/286,752

(22) Filed: Feb. 27, 2019

(65) Prior Publication Data

US 2019/0271904 A1 Sep. 5, 2019

(30) Foreign Application Priority Data

Mar. 2, 2018 (JP) ................................. 2018-037548

(51) Int. Cl.
*G03B 17/56* (2006.01)
*H05K 1/18* (2006.01)
*H04N 5/225* (2006.01)

(52) U.S. Cl.
CPC ......... *G03B 17/566* (2013.01); *H04N 5/2252* (2013.01); *H04N 5/22525* (2018.08); *H05K 1/189* (2013.01); *H05K 2201/10151* (2013.01)

(58) Field of Classification Search
CPC ............. G03B 17/566; H04N 5/22525; H04N 5/2252; H05K 1/189; H05K 2201/10151
See application file for complete search history.

(56) References Cited

U.S. PATENT DOCUMENTS

| | | | |
|---|---|---|---|
| 2003/0089776 A1* | 5/2003 | Hennick | G06K 7/10732 235/454 |
| 2007/0025108 A1* | 2/2007 | Kingsford | H05K 1/0284 362/294 |
| 2009/0059606 A1* | 3/2009 | Chien | H04N 5/2354 362/394 |
| 2014/0028905 A1* | 1/2014 | Kim | H04N 5/2257 348/374 |

(Continued)

FOREIGN PATENT DOCUMENTS

JP 2006-170266 A 6/2006

*Primary Examiner* — Amy R Hsu
(74) *Attorney, Agent, or Firm* — Cowan, Liebowitz & Latman, P.C.

(57) ABSTRACT

An accessory shoe device capable of preventing fall-off of fastening screws, without increasing the number of component parts. An accessory shoe device is mounted on an exterior member of an electronic apparatus. A fastening screws fastens a holding member disposed inside the exterior member, the exterior member, a terminal member attached to the exterior member and having a terminal to be connected to the accessory, and an engaging member on which the accessory is mounted, in the mentioned order, from inside the exterior member. A flexible circuit board is disposed on a surface of the holding member opposite to a contact surface thereof in contact with the exterior member, and is electrically connected to the terminal. The flexible circuit board is formed with a slit having a predetermined shape, thereby being provided with a flexible portion for pressing down a head of the fastening screw.

8 Claims, 6 Drawing Sheets

(56) References Cited

U.S. PATENT DOCUMENTS

| | | | |
|---|---|---|---|
| 2015/0015713 A1* | 1/2015 | Wang | H04N 7/18 |
| | | | 348/148 |
| 2015/0049244 A1* | 2/2015 | Tokunaga | G03B 17/14 |
| | | | 348/375 |
| 2017/0222384 A1* | 8/2017 | Seo | H01R 33/7664 |
| 2018/0242480 A1* | 8/2018 | Liu | H05K 9/0058 |
| 2018/0253279 A1* | 9/2018 | Pawar | G06F 3/167 |

* cited by examiner

ACCESSORY SHOE DEVICE CAPABLE OF PREVENTING FALL-OFF OF FASTENING SCREW BY SAVING SPACE, AND ELECTRONIC APPARATUS

BACKGROUND OF THE INVENTION

Field of the Invention

The present invention relates to an accessory shoe device for mounting an accessory thereon and an electronic apparatus including the accessory shoe device.

Description of the Related Art

There has been conventionally used an image capture apparatus including an accessory shoe device for mounting thereon an accessory for photographing, such as an electronic viewfinder (external display apparatus) and an external strobe device (hereinafter referred to as the "accessory"). The accessory shoe device has an accessory engaging portion where the accessory is mounted, and the accessory engaging portion is provided with connection terminals for electrically connecting to the accessory. On the other hand, the accessory has an engaged member for being engaged with the accessory engaging portion of the accessory shoe device, and the engaged member is provided with connected terminals for being electrically connected to the connection terminals of the accessory engaging portion. When the accessory is in a state mechanically mounted on the accessory shoe device, the connection terminals of the accessory engaging portion and the connected terminals of the engaged member are electrically connected to each other.

The accessory engaging portion is often mounted on an exterior member of the image capture apparatus, and in this case, for the reasons of assemblability and design, it is sometimes required to fasten the accessory engaging portion to the exterior member from inside of the image capture apparatus using screws. In a case where a screw fastens the accessory engaging portion to the exterior member, there is a possibility that application of impact or vibration to the screw causes gradual loosening of the screw, and hence in a case where screw fastening is performed from inside the image capture apparatus, it is necessary to prevent any loosened screw from coming off to fall inside the image capture apparatus. To eliminate this problem. Japanese Laid-Open Patent Publication (Kokai) No. 2006-170266 discloses a technique of preventing fall-off of a headed screw by fastening the same in a state in which the head of the headed screw is accommodated in a fall-off prevention spacer. According to the technique disclosed in Japanese Laid-Open Patent Publication (Kokai) No. 2006-170266, the headed screw is inserted into a hole of a main member, and in this state, the headed screw is fastened to a sub member. In a case where the headed screw has come off, an engaging hook provided on the spacer is engaged with an engaging surface of the main member, whereby the headed screw is prevented from falling off.

However, the above-described conventional technique requires provision of the spacer which is dedicated to prevention of fall-off of the screw, which results in an increase in the number of component parts. Further, it is required to secure a space for disposing the spacer and the engaging hook, which results in an increased size of the image capture apparatus.

SUMMARY OF THE INVENTION

The invention provides an accessory shoe device for an electronic apparatus on which an accessory shoe device is mounted from inside the electronic apparatus, using a screw, which is capable of preventing fall-off of the screw for fastening the accessory shoe device, by saving space and without increasing the number of component parts.

In a first aspect of the present invention, there is provided an accessory shoe device mounted on an exterior member of an electronic apparatus, comprising an engaging member on which an accessory is mounted, a terminal member which has a terminal to be connected to the accessory mounted on the engaging member, and is attached to the exterior member, a holding member disposed inside the exterior member, a fastening screw which fastens the holding member, the exterior member, the terminal member, and the engaging member, in the mentioned order, from inside the exterior member, and a flexible circuit board which is disposed on a surface of the holding member opposite to a contact surface of the holding member in contact with the exterior member, and is electrically connected to the terminal of the terminal member, wherein the flexible circuit board is provided with a flexible portion, by having formed in the flexible circuit board, a slit having a predetermined shape, and the flexible portion presses down a head of the fastening screw.

In a second aspect of the present invention, there is provided an electronic apparatus including an exterior member, and an accessory shoe device mounted on the exterior member, wherein the accessory shoe device comprises an engaging member on which an accessory is mounted, a terminal member which has a terminal to be connected to the accessory mounted on the engaging member, and is attached to the exterior member, a holding member disposed inside the exterior member, a fastening screw which fastens the holding member, the exterior member, the terminal member, and the engaging member, in the mentioned order, from inside the exterior member, and a flexible circuit board which is disposed on a surface of the holding member opposite to a contact surface of the holding member in contact with the exterior member, and is electrically connected to the terminal of the terminal member, wherein the flexible circuit board is provided with a flexible portion, by having formed in the flexible circuit board, a slit having a predetermined shape, and the flexible portion presses down a head of the fastening screw.

According to the present invention, it is possible to prevent the fastening screw from falling off, without increasing the number of component parts.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof. The following description will be given of an image capture apparatus as an electronic apparatus including an accessory shoe device according to an embodiment of the present invention and an external strobe device (hereinafter referred to as the "strobe device") as an accessory which is removably mounted on the accessory shoe device. However, the electronic apparatus according to the invention is not limited to image capture apparatuses, nor the accessory removably mounted on the accessory shoe device is not limited to strobe devices.

Figure 1:
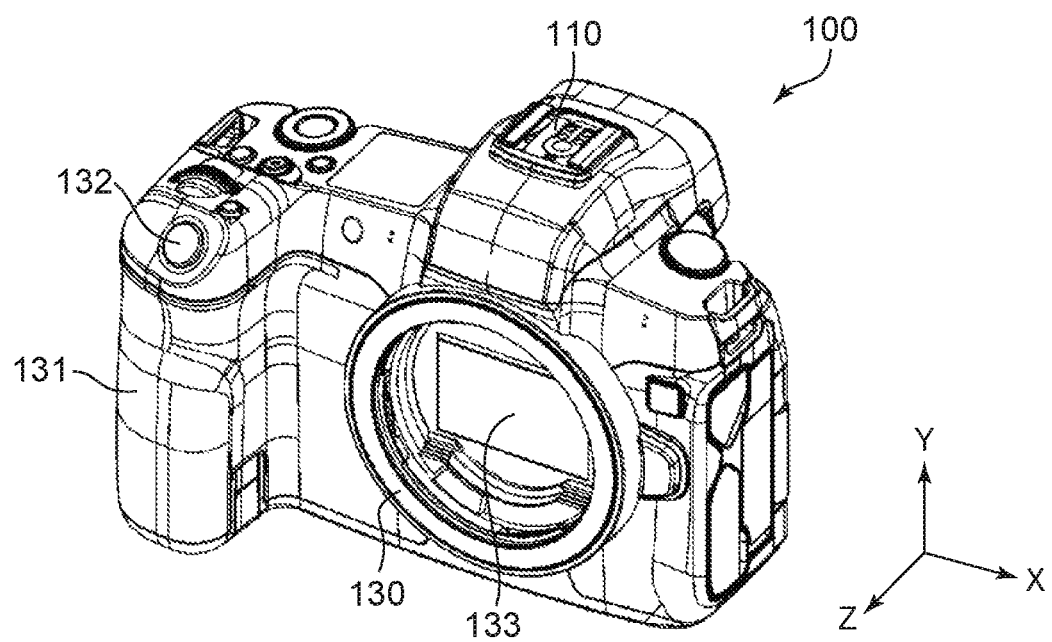
FIG. 1 is a perspective view of an image capture apparatus according to an embodiment of the present invention, as viewed from the front side.
Figure 2:
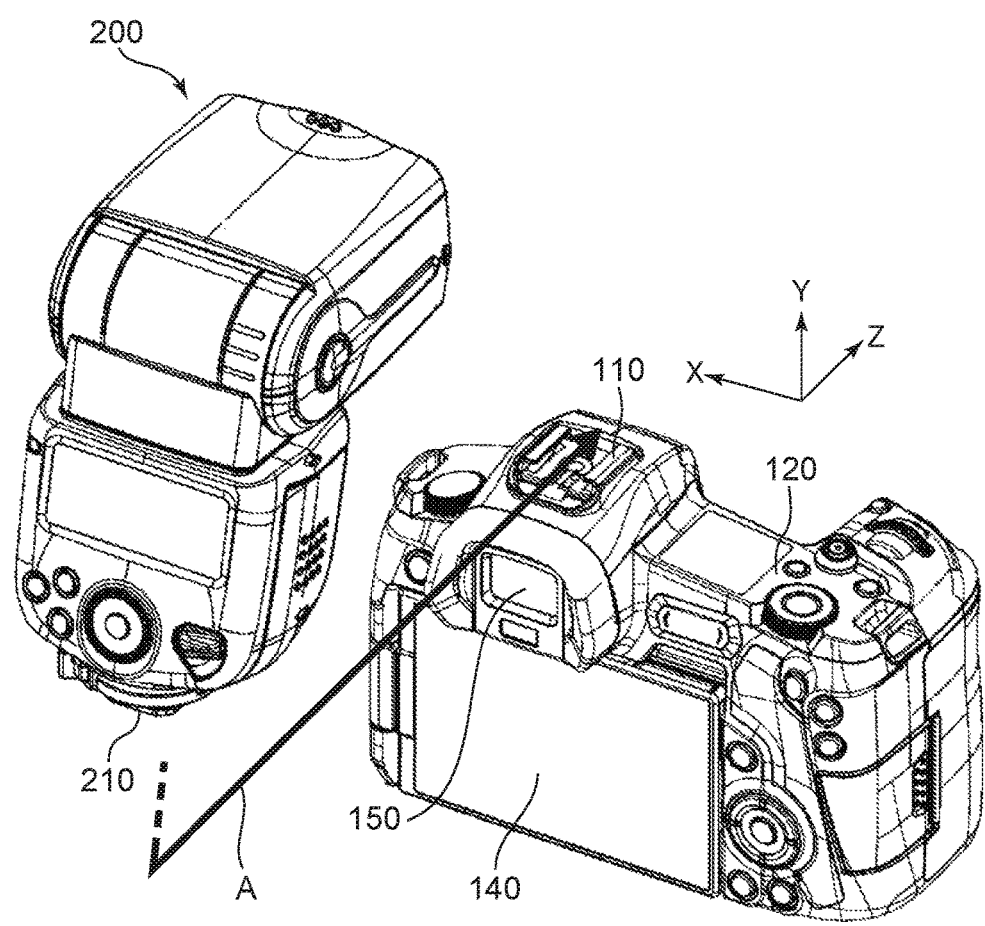
FIG. 2 is a perspective view schematically illustrating how a strobe device is mounted on the image capture apparatus shown in FIG. 1.

FIG. 1 is a perspective view of the image capture apparatus, denoted by reference numeral 100, as viewed from the front side. FIG. 2 is a perspective view of the image capture apparatus 100 as viewed from the rear side, schematically illustrating how the strobe device, denoted by reference numeral 200, is mounted on the image capture apparatus 200. For the convenience of explanation, an X direction, a Y direction, and a Z direction, which are orthogonal to one another, are defined as shown in FIGS. 1 and 2. The Z direction is a direction parallel to an imaging optical axis of the image capture apparatus 100 in a state having an interchangeable lens unit, not shown, mounted thereon, and hence is a front-rear direction of the image capture apparatus 100. Note that the Z direction is also a direction perpendicular to an imaging surface of an image capture device 133 provided in the image capture apparatus, on which an optical image is formed. The X direction is a lateral direction of the image capture apparatus 100, and the Y direction is a vertical direction of the same.

The image capture apparatus 100 is, for example, a lens-exchangeable digital camera (digital single-lens reflex camera). As shown in FIG. 1, the image capture apparatus 100 includes the accessory shoe, denoted by reference numeral 110, and a mounting portion 130 enabling an interchangeable lens unit to be mounted thereon and removed therefrom. Further, the image capture apparatus 100 is provided with a grip portion 131 on a left side of the mounting portion 130 as viewed from the front side, and a release button 132 at a location upward of the grip portion 131. Inside the image capture apparatus 100, there is disposed an image capture device 133. As shown in FIG. 2, the image capture apparatus 100 includes a liquid crystal monitor 140, a viewfinder 150, and a top cover 120. The user of the image capture apparatus 100 can confirm an object image using the liquid crystal monitor 140 or the viewfinder 150.

The accessory shoe 110 forms part of the top cover 120 of the image capture apparatus 100. The accessory shoe 110 is defined as an accessory mounting and removing unit, i.e. a unit formed of component elements directly involved in the mounting and removal of the strobe device 200 as an accessory. Further, a unit including not only the accessory shoe 110, but also various members provided in the accessory shoe 110 and a structure provided in the image capture apparatus 100, for equipping the image capture apparatus 100 with the accessory shoe 110, is defined as the "accessory shoe device". Examples of the component parts of the accessory shoe 110 and the accessory shoe device will be described hereinafter. The top cover 120 is an exterior member forming the appearance of the top of the image capture apparatus 100, and is formed of a metal material or a resin material. In the present embodiment, it is assumed that the top cover 120 is an exterior member made of a metal, such as magnesium.

The strobe device 200 is used to emit a flash of light for photographing when the amount of light is insufficient. To mount the strobe device 200 on the image capture apparatus 100, the strobe device 200 is provided with an engaged member 210 which is engaged with the accessory shoe 110 by a sliding method. As shown in FIG. 2, by sliding the strobe device 200 in the Z direction as indicated by an arrow A, the engaged member 210 can be engaged with the accessory shoe 110.

The strobe device 200 can be repeatedly mounted on and removed from the accessory shoe 110 (the image capture apparatus 100), and whenever the strobe device 200 is mounted on or removed from the accessory shoe 110, impact or vibration is applied to the accessory shoe device. Therefore, it is demanded that the accessory shoe device has a high durability against the repeated impact and vibration.

Figure 3A:
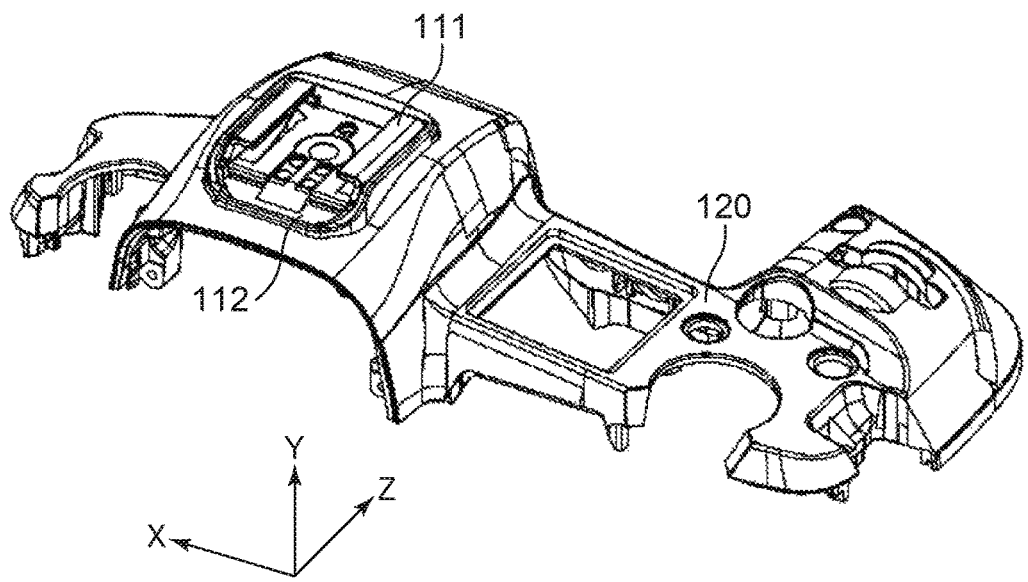
FIGS. 3A and 3B are perspective views of an accessory shoe device included in the image capture apparatus.
Figure 3B:
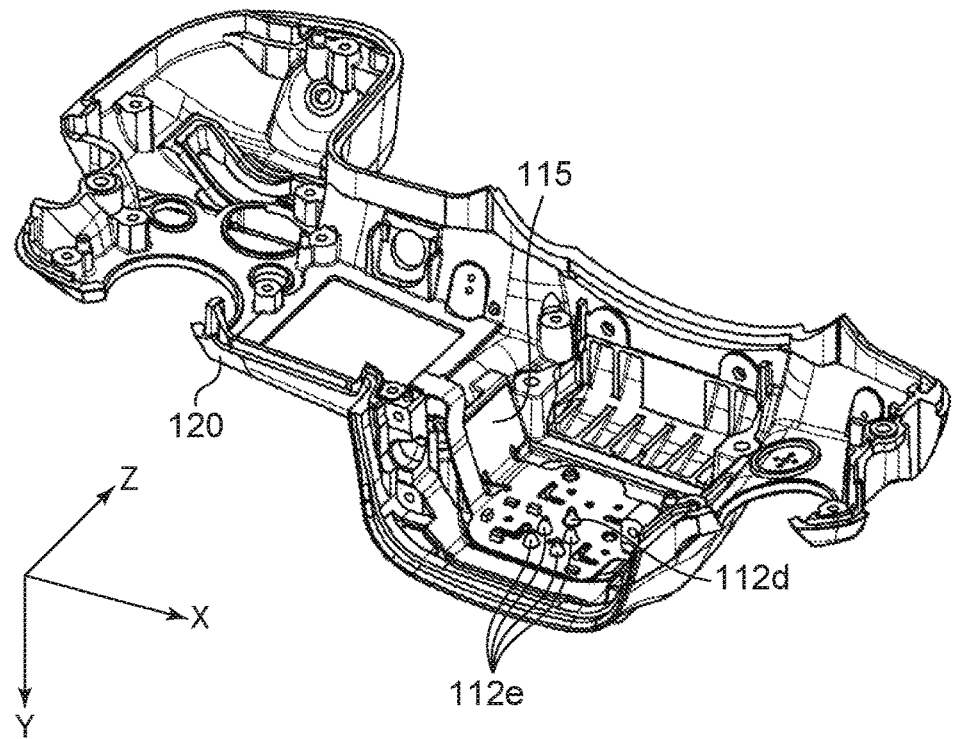
Figure 4:
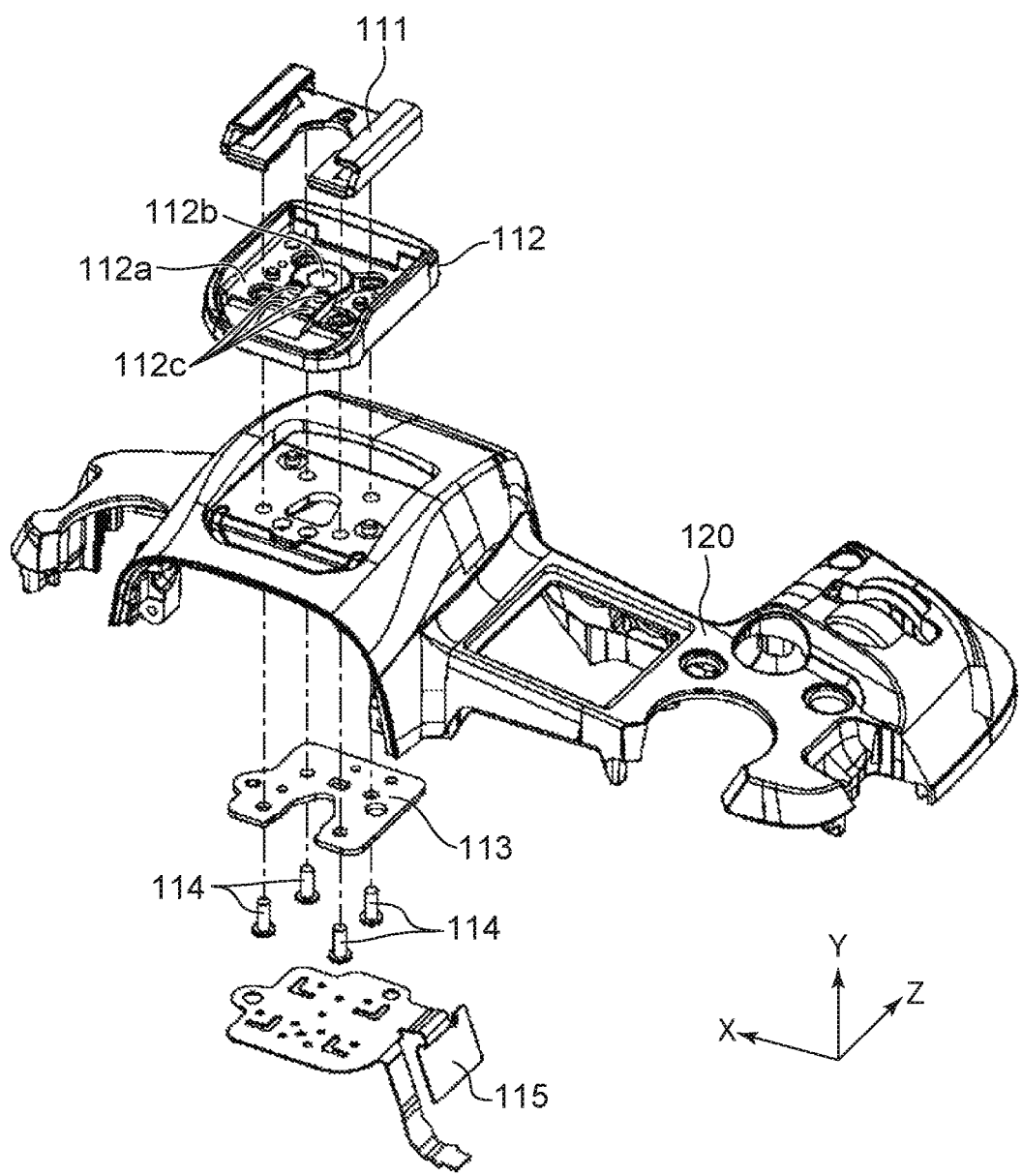
FIG. 4 is a first exploded perspective view of the accessory shoe device.
Figure 5:
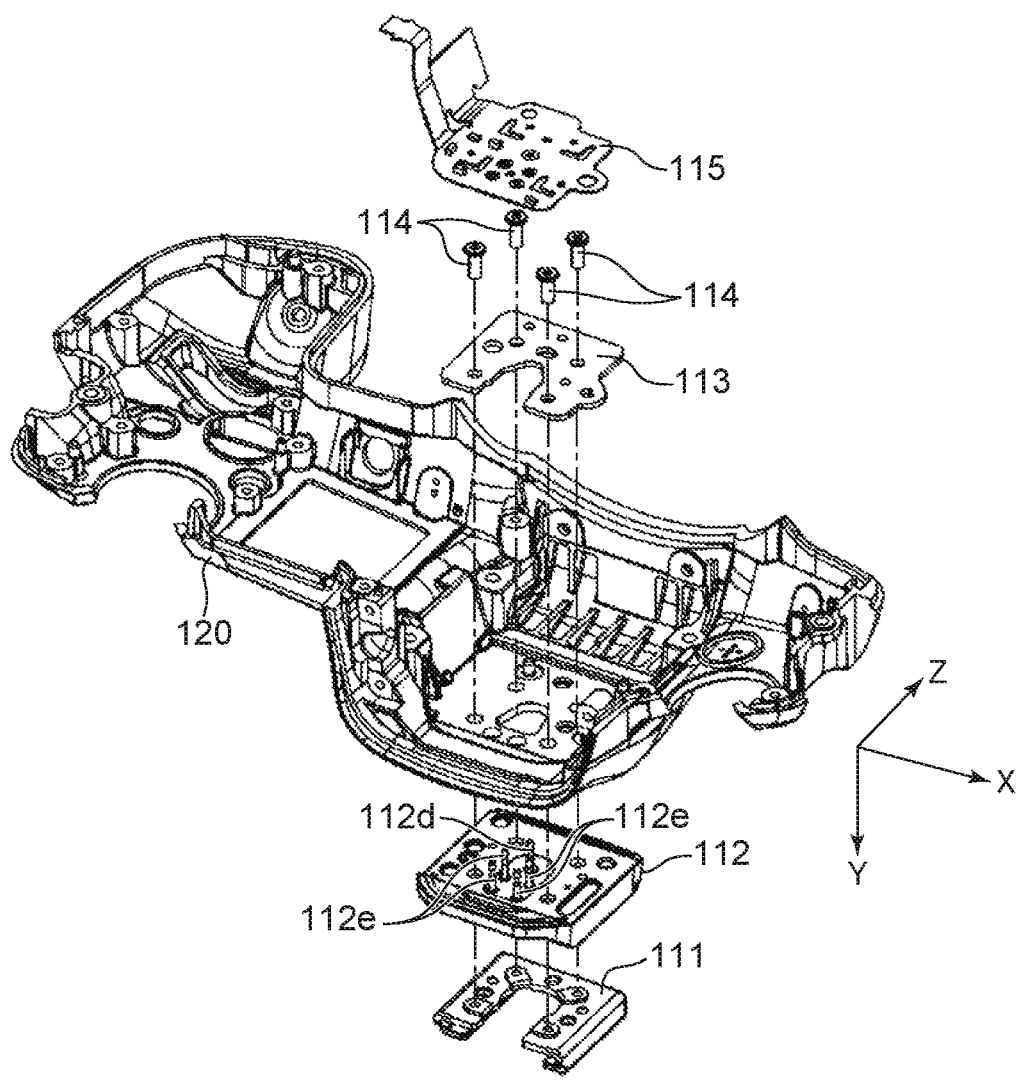
FIG. 5 is a second exploded perspective view of the accessory shoe device.

Next, the construction of the accessory shoe device will be described in detail. FIG. 3A is a perspective view of the accessory shoe device as viewed from above and rear. FIG. 3B is a perspective view of the accessory shoe device as viewed from below and rear. FIG. 4 is a first exploded perspective view of the accessory shoe device. FIG. 5 is a second exploded perspective view of the accessory shoe device. The first and second exploded perspective views of FIGS. 4 and 5 are different in the direction of viewing the accessory shoe device, as is apparent from the axes of the coordinate system indicated in each figure.

The accessory shoe 110 has a terminal member 112 for electrically connecting to the strobe device 200. The engaging member 111 is positioned with respect to the terminal member 112, and the terminal member 112 is positioned with respect to the top cover 120. In the top cover 120, a portion where the accessory shoe 110 is disposed is included in the component elements of the accessory shoe device.

The engaging member 111 holds a selected one of various accessories including the strobe device 200 by engagement therewith. The engaging member 111 is in the form of a slider capable of engaging with the engaged member 210 of the strobe device 200 by having the same slid in the direction indicated by the arrow A in FIG. 2. Note that for the accessory shoe 110, JIS specifies a shape and the like required for enabling the strobe device 200 to be mounted thereon, and in the present embodiment as well, the shape and the like of the accessory shoe 110 conform to the specifications of JIS. For the engaging member 111, a metal material is used from the viewpoint of strength and durability, and for example, cold-rolled steel or the like subjected to plating can be used.

The terminal member 112 includes a base portion 112a formed of a synthetic resin material, a synchronizer contact 112b held in the base portion 112a, and a plurality of contracts 12c. When the strobe device 200 is mounted on the accessory shoe 110, the contacts 112b and 112c are electrically connected to contacts of a terminal member, not shown, provided in the engaged member 210. Thus, it is made possible to perform two-way communication of control signals between a controller, not shown, of the image capture apparatus 100 and a controller, not shown, of the strobe device 200

The accessory shoe device includes, in addition to the accessory shoe 110 (the engaging member 111 and the terminal member 112), a holding member 113 disposed inside the image capture apparatus 100, with the top cover 120 sandwiched between the same and the accessory shoe 110, fastening screws 114, and a flexible circuit board 115. The holding member 113 is a component (structure skeleton) for holding the engaging member 111, and is positioned with respect to the top cover 120. For the holding member 113, a metal material is used from the viewpoint of strength, and for example, cold-rolled steel or the like subjected to plating can be used.

The fastening screws 114 are inserted from the holding member 113 through the top cover 120 and the terminal member 112 and are fastened to the engaging member 11. By fastening the fastening screws 114, the engaging member 111, the terminal member 112, the top cover 120, and the holding member 113 are tightened and fixed in a state laminated in the mentioned order in the Y direction (see FIG. 6B). The fastening screws 114 fasten the associated components from inside the image capture apparatus 100, and hence the) do not appear in the appearance of the image capture apparatus 100.

As shown in FIG. 5, from the synchronizer contact 112b and the contacts 112c of the terminal member 112, an extended portion 112d and extended portions 12e protrude in a −Y direction (toward the holding member 113). When the engaging member 111, the terminal member 112, the top cover 120, and the holding member 113 are in the state fastened by the fastening screws 114, the extended portions 112d and 112e protrude beyond the holding member 113 into the inside of the image capture apparatus 100. The flexible circuit board 115 is formed with soldering holes into which the extended portions 112d and 112e are inserted, and as shown in FIG. 3B, the extended portions 112d and 112e are each soldered in the state inserted into the associated soldering hole. Thus, the flexible circuit board 115 is mechanically fixed and electrically connected to the terminal member 112, in a state disposed on a −Y-direction side of the holding member 113 (in a state sandwiching the holding member 113 between the same and the top cover 120).

Figure 6A:
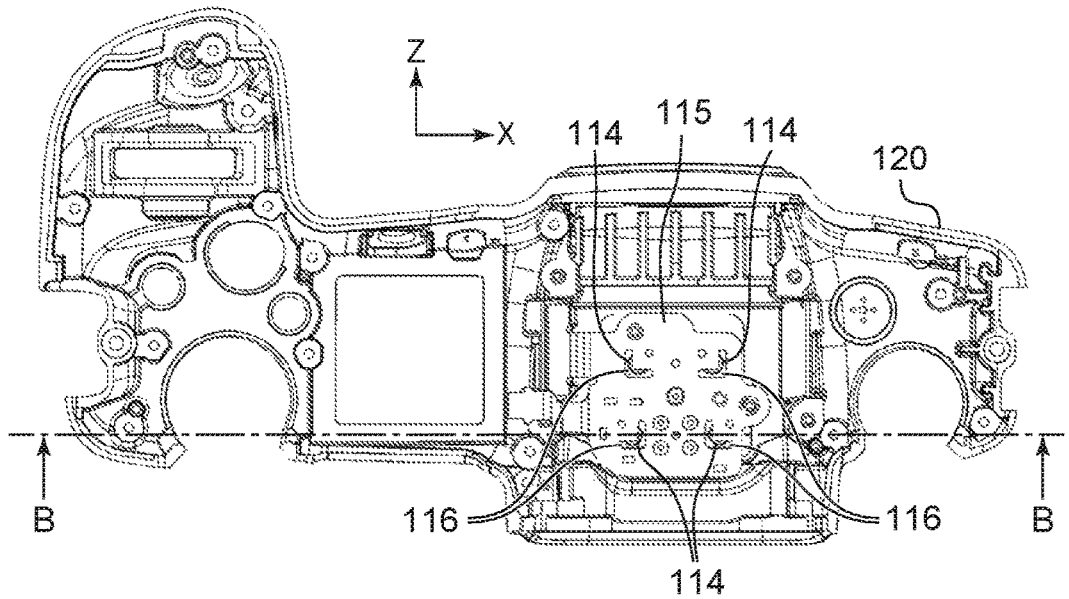
FIGS. 6A and 6B are views useful in explaining an assembled state of a flexible circuit board.
Figure 6B:
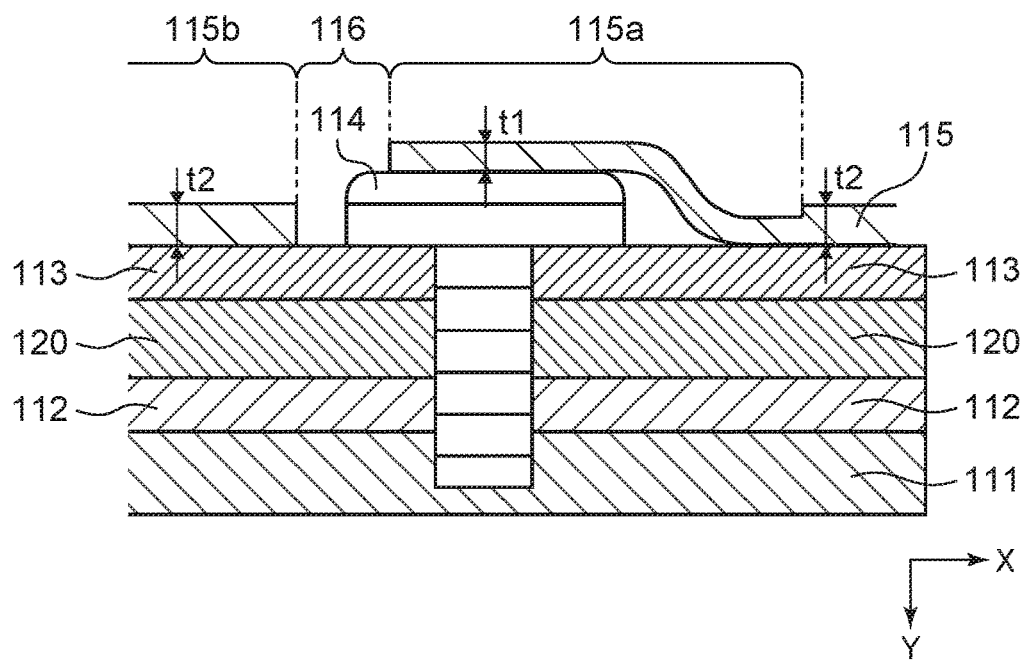

FIGS. 6A and 6B are views useful in explaining an assembled state of the flexible circuit board 115. FIG. 6A is a plan view of the image capture apparatus 110 as viewed from inside thereof. FIG. 6B is a cross-sectional view of one of the fastening screws 114 and its vicinity taken along a line indicated by arrows B and B in FIG. 6A.

The impact and vibration applied to the accessory shoe device when the strobe device 200 is mounted on or removed from the accessory shoe can loosen the fastening of the fastening screws 114 to the holding member 113 and the like. When the loosening of any fastening screw 114 proceeds, there is a fear that the fastening screw 114 comes off and falls inside the image capture apparatus 100, and the fallen fastening screw has a possibility of impairing any of the basic functions of the image capture apparatus 100. To cope with this problem, the soldering of the extended portions 112d and 112e to the flexible circuit board 115 is performed after the holding member 113 and so forth are fastened by the fastening screws 114. With this, the flexible circuit board 115 is arranged, as shown in FIGS. 6A and 6B, to cover the heads of the fastening screws 114, and thereby press down the heads of the fastening screws 114 toward the holding member 113. In doing this, as will be described hereinafter, flexible portions 115a formed on the flexible circuit board 115 press down the heads of the fastening screws 114, respectively. Thus, there is adopted a structure that the flexible circuit board 115 prevents fall-off of the fastening screws 114, whereby it is possible to improve the reliability of the image capture apparatus 100.

The flexible circuit board 115 has a thickness of 0.1 mm to 0.23 mm, and is also made of a flexible material, which enables the flexible circuit board 115 to be disposed within a limited narrow space. Further, the flexible circuit board 115 is originally a component used for electrical connection to the accessory shoe 110, and hence it is possible to prevent the fastening screws 114 from coming off and falling without any additional component. That is, it is possible to avoid increase in manufacturing costs since there is no need to add any new component to the accessory shoe device.

As shown in FIG. 6A, the flexible circuit board 115 has L-shaped slits 116 (L-shaped through holes) formed in respective portions thereof near the fastening screws 114. The L-shaped slits 116 have advantageous effects of making it easier to cause local deformation of the portions of the flexible circuit board 115. That is, in the flexible circuit board 115, the slits 116 divide an area thereof opposed to the holding member 113 into the flexible portions 115a and flat potions 115b excluding the flexible portions 115a.

Each flexible portion 115a is a portion of the flexible circuit board 115, which is deformed in a manner stranded on the head of the fastening screw 114, and the slit 116 makes it easier for the flexible portion 115a to be deformed in a manner stranded on the head of the fastening skew 114. On the other hand, most part of the flat portion 115b is an area having a flat shape disposed such that it is brought into contact with a surface of the holding member 113 on a side thereof opposite to a contact surface thereof with which the top cover 120 is brought into contact. That is, the flat portion 115b, which is distinguished from the flexible portion 115a deformed in a manner stranded on the fastening skew 114, maintains a flat shape such that it is brought into contact with the holding member 113.

The flexible portion 115a is required to be deformed such that it is stranded on the head of the head of the fastening screw 114, and hence it is desirable that the flexible portion 115a is increased in flexibility by being made thinner than the flat portion 115b. In the present embodiment, the flexible circuit board 115 has a structure, as shown in FIG. 6B, that the flexible portion 115a has a thickness t1 which is smaller than a thickness t2 of a surrounding portion (flat portion 115b) of the flexible portion 115a. As a method of locally forming an area having a different thickness in the flexible circuit board 115, there is a method of making use of a layered structure of the flexible circuit board 115. More specifically, the flexible circuit board 115 is configured such that a copper film layer and a cover lay layer are laminated on a base film. Therefore, by partially eliminating a conductor layer and/or a cover, the whole thickness of flexible circuit board 115 can be made partially thinner. In the flexible circuit board 115, by eliminating the conductor layer, the flexible portion 115a is formed which is smaller in thickness than the flat portion 115b and has a high flexibility.

In the flexible circuit board 115, it is desirable that the slit 116 is configured to have a shape which enables soldering holes for soldering the terminal member 112 to be formed in the flat portion 115b. This is because in a case where no flexible portions 115a are provided, the flat portions 115b can float from the holding member 113, so that the workability of soldering the extended portions 112d and 112e of the terminal member 112 is lowered and the quality of soldering suffers from undesired variation. By providing the flexible portions 115a while securing flatness of the flat portions 115b, and providing the soldering holes in the flat portions 115b, it is possible to improve the workability of soldering the extended portions 112d and 112e of the terminal member 112 and thereby ensure stable soldering quality. In a case where a component is mounted on the flexible circuit board 115, it is desirable that the slit 116 is configured to have a shape which enables the component to be mounted on one of the flat portions 115b. This makes it possible to prevent the mounted component from detaching or falling off due to deformation of the flexible circuit board 115.

To reduce the loosening of the fastening screws 114, adhesive is sometimes applied to the fastening screws 114. In view of this, the shape and location of each slit 116 are designed such that adhesive can be applied to the fastening screws 114. More specifically, to make it possible to apply adhesive to the fastening screws 114 after they are assembled to the flexible circuit 115, the location and width (shape) of each slit 116 are designed such that part of the head of each fastening screw 114 is exposed from the slit 116. At this time, as shown in FIG. 6A, one side of the L shape is formed parallel to the Z direction, whereby the other side of the L shape is inevitably formed to be parallel to the X direction. With this, the adhesive applied to the fastening screws 114 is made easier to exhibit loosening-reducing effects against the impact forces in the Z direction in which the strobe device 200 is moved to be mounted and removed and in the X direction orthogonal to the Z direction. Although in the present embodiment, the fastening screw 114 is described as an example of the fastening member, this is not limitative, but the fastening screws 114 may be replaced by bolts, large-sized screws or the like.

Although the present invention has been described heretofore based on the preferred embodiment thereof, the present invention is not limited to the specific embodiment described above, but includes other embodiments and modifications within the scope and sprit thereof. For example, although in the accessory shoe device according to the embodiment described above, the terminal member 112 is provided as a separate member from the top cover 120, the terminal member 112 may be integrally and seamlessly formed on the top cover 120. Further, although in the above-described embodiment, the slits 116 are each formed in an L-shape, they may be configured to have any predetermined shape that enables the flexible portions 115*a* and flat portions 115*b* of the flexible circuit board 115 to exhibit the advantageous effects described above, and for example, can be formed to have a U shape.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-037548 filed Mar. 2, 2018 which is hereby incorporated by reference herein in its entirety.

What is claimed is:

1. An accessory shoe device mounted on an exterior member of an electronic apparatus, comprising:
   an engaging member on which an accessory is mounted;
   a terminal member which has a terminal to be connected to the accessory mounted on the engaging member, and is attached to the exterior member;
   a holding member disposed inside the exterior member;
   a fastening screw which fastens the holding member, the exterior member, the terminal member, and the engaging member, in the mentioned order, from inside the exterior member; and
   a flexible circuit board which is disposed on a surface of the holding member opposite to a contact surface of the holding member in contact with the exterior member, and is electrically connected to the terminal of the terminal member,
   wherein the flexible circuit board is provided with a flexible portion, by having formed in the flexible circuit board, a slit having a predetermined shape, and the flexible portion presses down a head of the fastening screw.

2. The accessory shoe device according to claim 1, wherein the predetermined shape of the slit is an L shape or a U shape.

3. The accessory shoe device according to claim 1, wherein a component part is mounted on an area of the flexible circuit board excluding the flexible portion.

4. The accessory shoe device according to claim 1, wherein the flexible circuit board is electrically connected to the terminal of the terminal member, via an area excluding the flexible portion.

5. The accessory shoe device according to claim 1, wherein the flexible circuit board is thinner in thickness in the flexible portion than in an area surrounding the flexible portion.

6. The accessory shoe device according to claim 1, wherein the head of the fastening screw is partially exposed from the slit formed in the flexible circuit board.

7. The accessory shoe device according to claim 1, wherein the engaging member has a shape formed such that the engaging member engages with an engaged member provided on the accessory, by sliding the engaged member with respect to the engaging member in a predetermined direction.

8. An electronic apparatus including:
   an exterior member, and
   an accessory shoe device mounted on the exterior member,
   wherein the accessory shoe device comprises:
   an engaging member on which an accessory is mounted;
   a terminal member which has a terminal to be connected to the accessory mounted on the engaging member, and is attached to the exterior member;
   a holding member disposed inside the exterior member;
   a fastening screw which fastens the holding member, the exterior member, the terminal member, and the engaging member, in the mentioned order, from inside the exterior member; and
   a flexible circuit board which is disposed on a surface of the holding member opposite to a contact surface of the holding member in contact with the exterior member, and is electrically connected to the terminal of the terminal member,
   wherein the flexible circuit board is provided with a flexible portion, by having formed in the flexible circuit board, a slit having a predetermined shape, and the flexible portion presses down a head of the fastening screw.

* * * * *